(12) United States Patent
Jeon et al.

(10) Patent No.: US 7,833,616 B2
(45) Date of Patent: Nov. 16, 2010

(54) SELF-ALIGNING NANOWIRES AND METHODS THEREOF

(75) Inventors: Yoocharn Jeon, Palo Alto, CA (US); Alfred I-Tsung Pan, Sunnyvale, CA (US); Hou T. Ng, Mountain View, CA (US); Scott Haubrich, Albuquerque, NM (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 760 days.

(21) Appl. No.: 11/281,192

(22) Filed: Nov. 16, 2005

(65) Prior Publication Data
US 2007/0111503 A1    May 17, 2007

(51) Int. Cl.
*H01L 27/14* (2006.01)
(52) U.S. Cl. .................................. 428/216; 977/762
(58) Field of Classification Search ............... 977/762; 428/216
See application file for complete search history.

(56) References Cited

U.S. PATENT DOCUMENTS

| | | | |
|---|---|---|---|
| 6,041,600 A * | 3/2000 | Silverbrook | 60/528 |
| 6,248,674 B1 | 6/2001 | Kamins et al. | |
| 6,428,957 B1 | 8/2002 | Delenstarr | |
| 6,720,240 B2 | 4/2004 | Gole et al. | |
| 6,741,019 B1 * | 5/2004 | Filas et al. | 313/355 |
| 7,129,554 B2 * | 10/2006 | Lieber et al. | 257/414 |
| 7,276,424 B2 * | 10/2007 | Wei | 438/406 |
| 2003/0197456 A1 * | 10/2003 | Den et al. | 313/309 |
| 2004/0106203 A1 * | 6/2004 | Stasiak et al. | 436/49 |
| 2004/0127130 A1 * | 7/2004 | Yi et al. | 442/376 |
| 2006/0188774 A1 * | 8/2006 | Niu et al. | 429/44 |
| 2008/0128761 A1 * | 6/2008 | Banin et al. | 257/288 |

OTHER PUBLICATIONS

T. I. Kamins et al.., "Trends in Nanotechnology: Self-Assembly and Defect Tolerance," NSF Partnership in Nanotech. Conf., Jan. 29-30, 2001, pp. 1-6.
J. L. Lin et al., "Self-assembled Fe nanowires using organometallic chemical vapor deposition and CaF2 masks on stepped Si(111)," App. Phy. Ltrs, 78/6, Feb. 2001, pp. 829-831.
T. Thurn-Albrecht et al., "Ultrahigh-Density Nanowire Arrays Grown in Self-Assembled Diblock Copolymer Templates," Science, 290, Dec. 2000, pp. 2126-2129.
J. L. Gole et al., "Direct synthesis of silicon nanowires, silica nanospheres, and wire-like nanosphere agglomerates," App. Phy. Ltrs., 76/17, Apr. 2000, pp. 2346-2348.

* cited by examiner

*Primary Examiner*—Eugene Lee

(57) ABSTRACT

A self-aligning nanowire includes a nanowire portion and an aligning member attached to the nanowire portion. The aligning member interacts with another aligning member on an adjacent self-aligning nanowire to align the nanowires together. A method of aligning nanowires includes providing a plurality of the self-aligning nanowires, suspending the plurality in a carrier solution, and depositing the suspended plurality on a substrate. An ink formulation includes the plurality of suspended self-aligning nanowires in the carrier solution. A method of producing the self-aligning nanowire includes providing and associating the nanowire portion and the aligning member such that the nanowire produced is self-aligning with another nanowire.

24 Claims, 7 Drawing Sheets

SELF-ALIGNING NANOWIRES AND METHODS THEREOF

CROSS-REFERENCE TO RELATED APPLICATIONS

N/A

STATEMENT REGARDING FEDERALLY SPONSORED RESEARCH OR DEVELOPMENT

N/A

BACKGROUND

1. Technical Field

The invention relates to nanotechnology. In particular, the invention relates to structures having nano-scale feature sizes fabricated using nanowires.

2. Description of Related Art

Nanowires are individual low dimensional, nano-scale, structures typically characterized as having two quantum confined dimensions or directions (i.e., width and height) along with one unconfined dimension or direction (i.e., length). Individual nanowires may be fabricated as one or both of a single crystal and amorphous or multi-crystalline materials. The presence of the unconfined dimension in nanowires facilitates electrical conduction along that dimension. As such, nanowires may be used in applications requiring true electrical conduction instead of other forms of electron transport such as tunneling. Moreover, the confined and/or unconfined directions provide a specific density of electronic states that may impart significantly different electrical, optical and magnetic properties to nanowires as well as structures composed thereof when compared to similar structures comprising more conventional bulk crystalline materials. As such, nanowires, especially those comprising semiconductor materials, offer intriguing possibilities for use in structures comprising aggregated numbers of such nanowires.

Nanowires may be fabricated by a number of different techniques. For example, nanowires may be fabricated essentially simultaneously in relatively large quantities and then 'harvested' or otherwise collected together as detached or free nanowires. These free nanowires then may be deposited on a substrate or surface to produce aggregate structures composed of many nanowires. For example, the nanowires may be deposited on a substrate in a narrow linear cluster made up of a large number of nanowires. Such nanowire-based, linear clusters may be employed to interconnect circuit elements or components in an integrated circuit, for example, acting as a circuit trace or a wire-like interconnect. In another example, a large number of nanowires may be deposited on a substrate in a broad planar cluster to essentially form a film or sheet of nanowires (e.g., a nano-layer film). Such nanowire-based films may be patterned or otherwise modified to become a portion of a circuit element or component (e.g., a gate conductor of a field effect transistor) and/or a portion of a circuit interconnect.

Of particular interest are clusters of deposited nanowires or nanowire aggregate structures in which the constituent nanowires are generally oriented in a common direction. Among other things, such oriented aggregate structures facilitate exploiting the differences between the quantum confined and unconfined directions of the nanowires that make up the aggregation.

Accordingly, it would be desirable to have an approach that facilitated selectively orienting nanowires in deposited aggregated nanowire structures including one or both of linear clusters and broad planar clusters. Such an approach to selective nanowire orientation would solve a long-standing need in the area of nanotechnology and employing nanowires therewith.

BRIEF SUMMARY

In some embodiments of the present invention, a self-aligning nanowire is provided. The self-aligning nanowire comprises a nanowire portion; and an aligning member attached to the nanowire portion. The aligning member interacts with another aligning member on an adjacent nanowire to align the nanowires together.

In other embodiments of the present invention, a method of aligning nanowires is provided. The method of aligning comprises providing a plurality of self-aligning nanowires. A self-aligning nanowire comprises a nanowire portion and an aligning member attached to the nanowire portion. The method further comprises suspending the self-aligning nanowires in a carrier solution. The aligning members of the self-aligning nanowires interact with one or more of each other and a carrier solution environment to facilitate self-alignment of the nanowires with each other. The method of aligning further comprises depositing the suspended self-aligning nanowires on a substrate.

In other embodiments of the present invention, an ink formulation for an inkjet printer deposition system is provided. The ink formulation comprises a plurality of self-aligning nanowires. A self-aligning nanowire comprises a nanowire portion and an aligning member attached to the nanowire portion. The aligning member interacts with the aligning member of another self-aligning nanowire of the plurality to align the nanowires. The ink formulation further comprises a carrier solution that suspends the plurality of self-aligning nanowires. The carrier solution facilitates alignment of the self-aligning nanowires with each other.

In other embodiments of the present invention, a method of producing a self-aligning nanowire is provided. The method of producing comprises providing a nanowire portion and providing an aligning member. The aligning member has an interactive property. The method further comprises associating the aligning member with the nanowire portion such that a nanowire is produced that is self-aligning with another of the nanowire. The interactive property of the aligning members facilitates self-alignment.

Certain embodiments of the present invention have other features in addition to and/or in lieu of the features described hereinabove. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
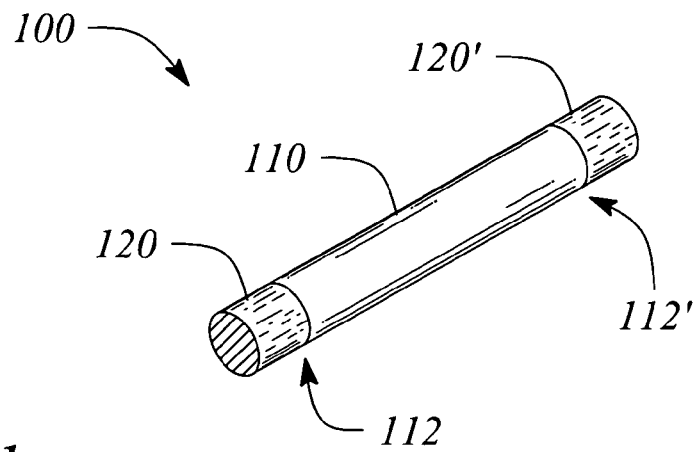
FIG. 1 illustrates a perspective view of a self-aligning nanowire according to an embodiment or the present invention.

The embodiments of the present invention facilitate directionally orienting or aligning nanowires with respect to one another and/or depositing nanowires as a directionally ordered or oriented cluster on a substrate. In particular, the nanowires are essentially self-aligning according to the present invention. As such, the self-aligning nanowires essentially automatically line up or align with respect to one another one or more of prior to, during, and following deposition on the substrate. In some embodiments, the nanowires of a deposited oriented nanowire cluster form an aggregated nanowire structure that may be mechanically and/or electrically interconnected.

The self-aligning nanowire comprises a nanowire portion and an interactive portion or aligning member. In some embodiments, the aligning members of adjacent self-aligning nanowires interact with one another to effect alignment or orientation of the nanowires. In such embodiments, the aligning member imparts one or both of physical forces and chemical forces on another aligning member of another self-aligning nanowire such that adjacent nanowires physically align together. The physical forces and/or chemical forces that facilitate alignment include, but are not limited to, attractive, magnetic, electrostatic and van der Waals' forces, such that a range of weak to strong chemical bonds may be achieved, depending on the embodiment. In some embodiments, alignment may be further facilitated by repulsive forces imparted by some aligning members.

In other embodiments, the aligning member interacts with a local environment that surrounds the self-aligning nanowire such that nanowire orientation is achieved. In yet other embodiments, the aligning member interacts both with a local surrounding environment and with the aligning members of adjacent self-aligning nanowires to effect nanowire alignment.

In some embodiments, the aligning member acts to align the nanowires with respect to one another prior to deposition. For example, the aligning members facilitate an end-to-end directional alignment of nanowires while suspended in a carrier solution that may be a fluid, such as a vapor or a liquid, depending on the embodiment. When the aligned nanowires in the carrier solution are deposited on a substrate and the solution is removed, the nanowires retain the end-to-end alignment to form an aligned cluster on the substrate. In other embodiments, the aligning members facilitate a side-to-side or side-by-side directional alignment of the suspended nanowires in the carrier solution. As mentioned above for the end-to-end alignment embodiment, the side-to-side alignment is retained after the nanowires are deposited on the substrate. In still other embodiments, the aligning members facilitate both end-to-end and side-to-side alignments of the same nanowires in the carrier solution and as deposited as a nanowire cluster. In other embodiments, the aligning members act to align the nanowires with respect to one another following deposition on a substrate.

In some embodiments, the aligning member facilitates attaching one self-aligning nanowire to an adjacent self-aligning nanowire. In such embodiments, the aligned cluster on the substrate is a connected aggregate structure of nanowires. The connection may be one or both of a mechanical connection and an electrical connection. For example, a mechanical connection and an electrical connection between end-to-end aligned nanowires may be produced by fusing conductive aligning members located at adjacent ends of the nanowires. In other embodiments, the connections between deposited, aligned nanowires may be produced by adding material to the deposited nanowires. An example of adding material to fuse deposited nanowires is described by Pan et al. in co-pending U.S. Patent Application entitled "Fusing Nanowires using In situ Crystal Growth", U.S. Ser. No. 11/077,830, filed Mar. 11, 2005, incorporated herein by reference. In yet other exemplary embodiments, aligning members may be located along a main axis of the nanowire wherein the aligning members are introduced one or both of during nanowire fabrication and post-fabrication.

FIG. 1 illustrates a self-aligning nanowire 100 according to an embodiment of the present invention. The self-aligning nanowire 100 is depicted as a cylindrical rod for illustrative purposes only and not by way of limitation herein. The self-aligning nanowire 100 illustrated in FIG. 1 comprises a nanowire portion 110 and a pair of aligning members 120, 120' at distal ends 112, 112' of the nanowire portion 110. In some embodiments, the aligning members 120, 120' of the pair are similar and interact with other similar aligning members on adjacent nanowires to facilitate self-alignment. As illustrated in FIG. 1, a first one of the aligning members 120 is attached to a first end 112 of the nanowire portion 110 while a second one of the aligning members 120' is attached to a second, distal end 112' of the nanowire portion 110.

The nanowire portion 110 of the self-aligning nanowire 100 illustrated in FIG. 1 may be essentially any conventional nanowire including a single crystal, amorphous, and multi-crystal nanowire as well as combinations thereof. In some embodiments, the nanowire portion 110 comprises a semiconductor material and may incorporate junctions and/or layers defined, at least in part, by different concentrations of a dopant. One skilled in the art is familiar with a wide variety of semiconducting, conducting, and insulating materials and combinations thereof that are employed to form nanowires. Essentially any such materials or material combinations in the form of nanowires may be used as the nanowire portion 110 of the self-aligning nanowire 100 according to the present invention.

For example, the nanowire portion 110 may comprise a semiconductor material made up of one or more constituent elements including, but not limited, to silicon (Si), gallium (Ga), arsenic (As), indium (In), phosphorus (P), germanium (Ge), selenium (Se), and carbon (C). In another example, the nanowire portion 110 may comprise a conductive material including, but not limited to, gold (Au), silver (Ag), copper (Cu), manganese (Mn), iron (Fe), nickel (Ni), titanium (Ti), tungsten (W), zinc (Zn), tin (Sn), aluminum (Al), chromium (Cr), cadmium (Cd), and bismuth (Bi), and alloys thereof. In yet another example, the nanowire portion 110 may comprise combinations of semiconducting and conducting materials (e.g., GaAs, GaAlAs, CdSe, and InP) and/or oxides and salts thererof (e.g., $ZnO$, $SiO_2$, $GeO_2$, and $CdCl_2$).

As mentioned above, the aligning member 120, 120' is located at, or is attached to, one or both ends 112, 112' of the nanowire portion 110 of the self-aligning nanowire 100. Generally, the aligning members 120, 120' are attached to the nanowire portion 110 of the self-aligning nanowire 100 prior to deposition of the nanowire 100 on a substrate. For example, an aligning member 120, 120' of the pair may be attached during or as a part of the fabrication of the nanowire portion 110. Alternatively or additionally, an aligning member 120, 120' of the pair may be attached after fabrication of the nanowire portion 110 but prior to deposition.

In some embodiments, the aligning member 120, 120' may comprise a ferromagnetic particle 120, 120' attached to each of the distal ends 112, 112' of the respective nanowire portion 110. The ferromagnetic particle 120, 120' may be a nanocrystalline ferromagnetic particle, for example.

When the self-aligning nanowires 100 are suspended in a carrier solution or otherwise allowed to move freely, the magnetic fields produced by the ferromagnetic particles 120, 120' interact to attract the ferromagnetic particles 120, 120' attached to adjacent ones of the nanowires 100. The self-aligning nanowires 100 commingle and effectively attach together in an end-to-end configuration under the magnetic attractive force of the ferromagnetic particle aligning members 120, 120'.

Figure 2A:
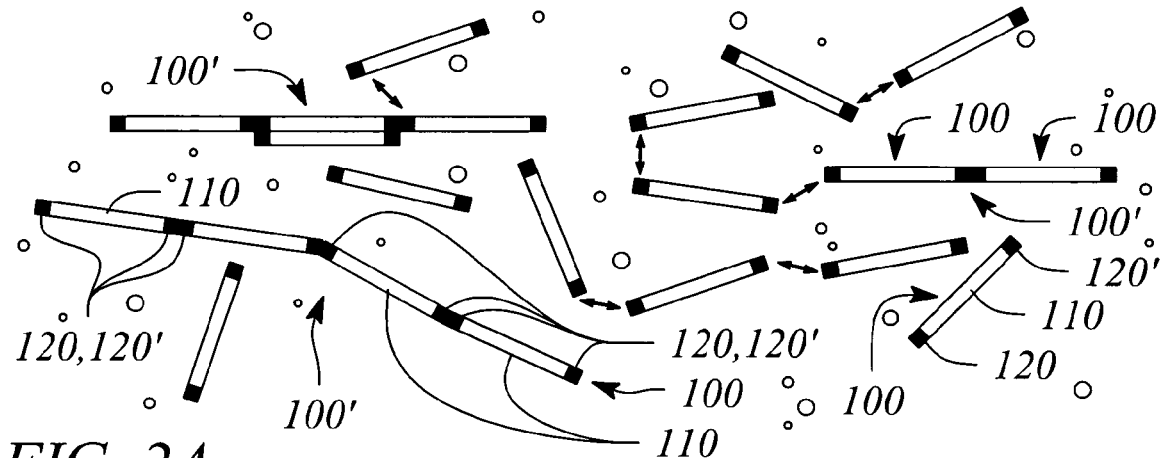
FIG. 2A illustrates a perspective view of several self-aligning nanowires of FIG. 1 suspended in a carrier solution according to an embodiment or the present invention.

FIG. 2A illustrates several self-aligning nanowires 100 of FIG. 1 having ferromagnetic particle aligning members 120, 120' suspended in a carrier solution (e.g., an aqueous solution). The attractive forces exerted by the end-attached ferromagnetic particle aligning members 120, 120' attract adjacent nanowires 100 to one another. In particular, magnetic fields generated by respective ones of the ferromagnetic particles 120, 120' interact with and thus attract other ferromagnetic particles 120, 120' of other nanowires 100 as indicated by the bold arrows in FIG. 2A. As a result, adjacent nanowires 100 are essentially self-aligned and ultimately tend to become connected together by the magnetic attractive force exerted by the ferromagnetic particles 120, 120'.

As multiple nanowires 100 are aligned and connected together by the action of the ferromagnetic particles 120, 120', extended, aligned clusters 100' of nanowires 100 form. Both end-to-end directional alignment and side-to-side directional alignment may be achieved, as illustrated in FIG. 2A. The extended, aligned clusters 100' may form without application of an external stimulus and therefore the nanowires 100 are said to self-align. While the self-aligning nanowires 100 will self-align, in some embodiments, an external inducement, such as a magnetic field when the aligning members are magnetic, may be applied to assist in and/or further facilitate alignment the self-aligning nanowires 100, which is still within the scope of the various embodiments described herein.

Figure 2B:
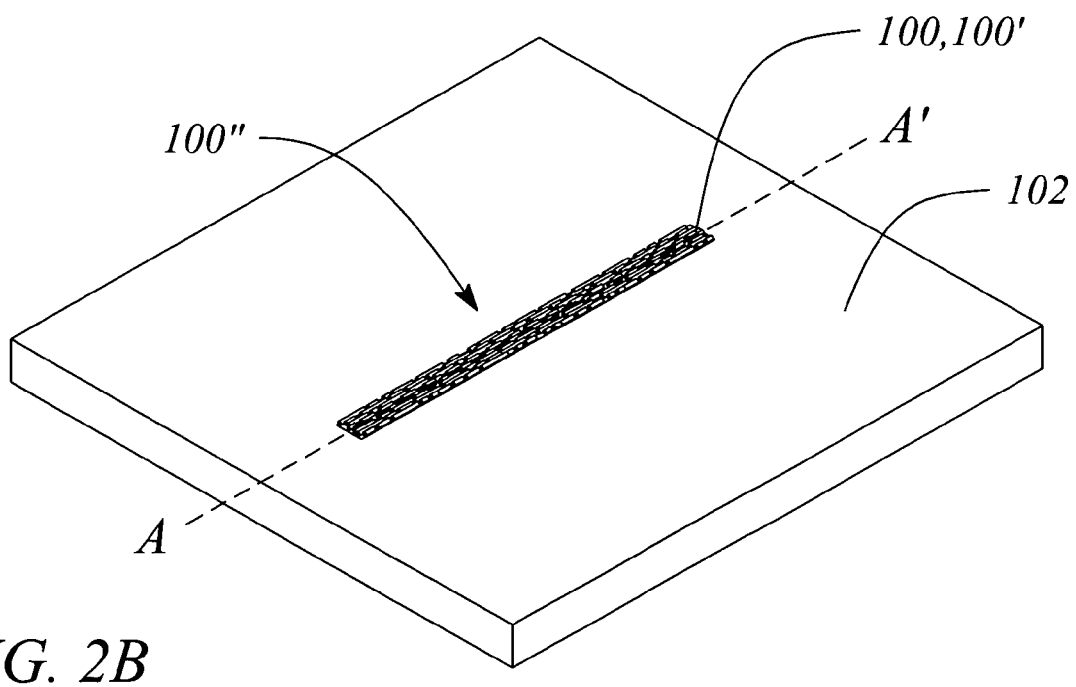
FIG. 2B illustrates a perspective view of the self-aligning nanowires of FIG. 2A following deposition on a substrate according to an embodiment of the present invention.

FIG. 2B illustrates the self-aligning nanowires 100 of FIG. 2A following deposition on a substrate 102. As illustrated, the self-aligning nanowires 100 remain attached to one another and retain the aligned orientation imparted by the magnetic attraction between the respective ferromagnetic particles 120, 120' of the nanowires 100. Hence, an oriented or aligned aggregate nanowire structure 100" is created on the substrate as a result of deposition.

In some embodiments, thermal annealing or a similar process (e.g., sintering) is employed to fuse the aligned nanowires 100 following deposition. The fused nanowires 100 in the aggregate nanowire structure 100" generally exhibit a lower aggregate resistivity than that prior to thermal annealing. In some embodiments, the ferromagnetic particles 120, 120' of attached nanowires 100 fuse to form an ohmic contact between adjacent nanowires 100.

The self-aligning nanowires 100 may be fabricated according to a number of different methods. In some embodiments, the nanowire portion 110 and the aligning member 120, 120' (e.g., ferromagnetic particle) are fabricated separately. The aligning member or members 120, 120' are then connected to the ends 112, 112' of the nanowire portion 110. As such, the nanowire portion 110 may be fabricated or formed using essentially any method of producing nanowires known in the art. For example, nanowires may be 'grown' using methods such as, but not limited to, vapor-liquid-solid (VLS), solution-liquid-solid (SLS), and non-catalytic vapor-phase epitaxy. Other methods for producing nanowires include, but are not limited to, template-assisted synthesis, nanoimprint lithography, dip-pen nanolithography, self-assembly of nanoparticles, solution phase methods based on capping reagents, and solvothermal methods. Fabrication of silicon (Si) nanowires is described by Gole et al., in U.S. Pat. No. 6,720,240, incorporated herein by reference. Similar methods may be employed to produce the nanoparticles that may act as the aligning members 120, 120', for example.

Once fabricated, the aligning members 120, 120' may be applied and connected to the ends 112, 112' of the nanowire portions 110. For example, an epoxy or similar adhesive may be employed to connect the separately fabricated aligning members 120, 120' to the nanowire portion 110. In another example, a brazing or soldering operation may be employed to achieve the connection. In yet another example, a chemical bond or a deposition technique may be employed.

For example, one or more of the nanowire portion(s) 110 may be encased in a matrix (e.g., silicon dioxide, epoxy resin, photoresist, etc.) that holds and generally protects the encased nanowire portion 110. One or both of the ends 112, 112' of the nanowire portion 110 are then exposed by removing some of the matrix using an etchant or by another appropriate technique depending on the matrix employed. The exposed ends 112, 112' then may be chemically treated to prepare a reactive surface on the exposed ends 112, 112'. The aligning members 120, 120' are applied to and chemically bonded with the reactive surface using a conventional technique. The one or more nanowire portions 110 is/are then released from the matrix with the applied aligning members 120, 120' chemically attached to the ends 112, 112'.

In another example, a deposition technique such as, but not limited to, evaporation or sputtering, may be employed to deposit the aligning members 120, 120' onto the exposed ends 112, 112' of the nanowire portion(s) 110. For example, one or more separately fabricated nanowire portion(s) 110 may be encased in a matrix and the ends 112, 112' exposed as described above. Material of the aligning members 120, 120' is then deposited onto the exposed ends 112, 112'. In some embodiments, a mask is employed during deposition to define a final configuration and/or shape of the aligning members 120, 120'. In other embodiments, post-deposition processing such as, but not limited to, etching, is employed to define the configuration and/or shape. As with the chemical attachment, the one or more nanowire portion(s) 110 is/are then released from the matrix with the deposited and defined aligning members 120, 120' attached to the ends 112, 112'.

In other embodiments, the self-aligning nanowires 100 are fabricated with the aligning members 120, 120' in-place on distal ends 112, 112' of the nanowire portion 110 during fabrication of the nanowire portion 110. In such embodiments, no post-fabrication attachment of the aligning members 120, 120' is necessary.

Figure 3A:
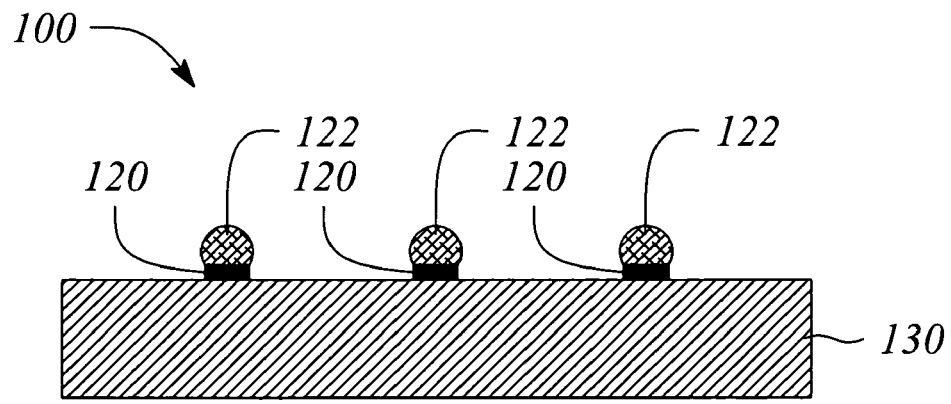
FIG. 3A illustrates a side view of a nanowire growth catalyst particle on a first set of nanocrystalline ferromagnetic particles according to an embodiment of the present invention

By way of example, FIGS. 3A-3E illustrate growth of self-aligning nanowires 100 with an in-place aligning member 120 of the pair 120, 120', the exemplary aligning members 120, 120' comprising nanocrystalline ferromagnetic particles. In particular, FIG. 3A illustrates a nanowire growth catalyst particle 122 on nanocrystalline ferromagnetic particles 120 according to an embodiment of the present invention. The nanocrystalline ferromagnetic particles 120 may be pre-formed and/or pre-deposited on a substrate 130 using any conventional nanoparticle fabrication method. The nanowire growth catalyst particle 122 comprises a material that facilitates growth of the nanowire portion 110. Hereinafter, the nanowire growth catalyst particle 122 and the material of the growth catalyst particle 122 may be referred to as 'catalyst particle 122' and 'catalyst material', respectively also, for purposes of simplicity herein and not limitation.

For example, when growing a nanowire portion 110 made of silicon (Si) on nanocrystalline ferromagnetic particles 120, the material of the deposited catalyst particle 122 may include, but is not limited to, gold (Au), nickel (Ni), titanium (Ti), iron (Fe), cobalt (Co), and gallium (Ga), and respective alloys thereof. Other catalyst materials include, but are not limited to, nonmetals, such as $SiO_x$, where x ranges from about 1 to less than 2, for example. Typical nanowire growth catalyst materials for Si nanowire growth corresponding to Ti and Au catalyst materials, for example, are respectively $TiSi_2$ and an Au—Si alloy.

The growth catalyst material may be deposited on the nanocrystalline ferromagnetic particles 120 using a deposition technique including, but not limited to, one or more of physical vapor deposition and chemical vapor deposition. Thermal evaporation, electron-beam evaporation and sputtering are physical vapor deposition techniques, for example. In some embodiments, the catalyst material is deposited to an average thickness ranging from about 0.01 nanometers (nm) to about 100 nm. At a thickness around the lower range of about 0.01 nm, the deposited catalyst material may form a discontinuous layer and the thicknesses averaged over an entire surface may be about 0.01 nm, while the layer may be locally thicker. In some embodiments, the catalyst material is deposited to a thickness ranging from about 0.1 nm to about 5 nm.

The catalyst material may be preferentially deposited on the nanocrystalline ferromagnetic particles 120 to form the catalyst particle 122. For example, a mask or resist layer may be employed to direct the catalyst material to preferentially deposit on the nanocrystalline ferromagnetic particles 120. In another example, exposed areas of a surface 132 of the substrate 130 surrounding the nanocrystalline ferromagnetic particles 120 may be passivated to discourage or essentially prevent adhesion of the catalyst material except on the nanocrystalline ferromagnetic particles 120. Alternatively, the catalyst material may be deposited generally over both the nanocrystalline ferromagnetic particles 120 and the surrounding substrate surface 132. Then the catalyst material is selectively removed from all but the nanocrystalline ferromagnetic particles 120 by a technique including, but not limited to, selective etching, to leave just the catalyst particle 122 on the ferromagnetic particles 120.

Following deposition, the catalyst material is optionally annealed to activate the catalyst particle 122. In some embodiments, annealing is performed in a closed, controlled environment. A closed, controlled environment includes, but is not limited to, a reactor chamber of a material deposition system where at least temperature and pressure are selectively controlled. For example, a titanium (Ti) catalyst material may be annealed to reduce native oxide on the Ti and form the $TiSi_2$. A gold (Au) catalyst material may be annealed (e.g., activated) to form the gold-silicon alloy (Au—Si) alloy.

Figure 3B:
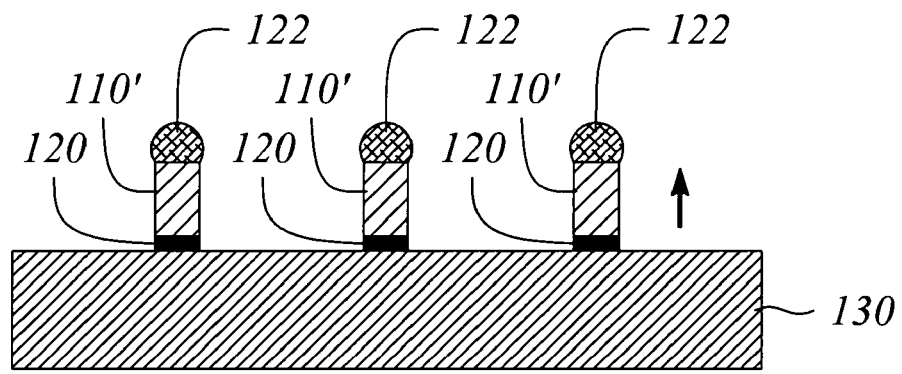
FIG. 3B illustrates a side view of growing a nanowire portion on top of the nanocrystalline ferromagnetic particles of FIG. 3A according to an embodiment of the present invention.

FIG. 3B illustrates growing the nanowire portion 110' on top of the nanocrystalline ferromagnetic particles 120 according to an embodiment of the present invention. Growing comprises exposing the activated catalyst particle 122 to a controlled temperature, pressure and a gas containing a material of the nanowire to be grown. For a silicon (Si) nanowire, a Si-containing gas is used, for example. For another semiconductor nanowire, the gas generally contains the precursors for the respective other semiconductor material. Nanowire portion 110' growth proceeds in a direction that is generally away from the ferromagnetic particles 120 and the substrate 130 as indicated by an arrow in FIG. 3B.

In some embodiments, the activated catalyst particle 122 is exposed to the gas in the reactor chamber of a material deposition system. As such, the temperature and pressure are regulated, and the gas or a gas mixture is introduced and controlled during nanowire portion 110' growth. For example, an Si-nanowire portion 110' grown using a CVD system and process may use a Si-containing gas, such as a gas mixture of silane ($SiH_4$) and hydrogen chloride (HCl) or a gas of dichlorosilane ($SiH_2Cl_2$) or silicon tetrachloride ($SiCl_4$) vapor in a hydrogen ($H_2$) ambient, to grow the Si-nanowire portion 110' from the catalyst particle 122 on the nanocrystalline ferromagnetic particles 120. Material deposition systems including, but not limited to, chemical vapor deposition (CVD) systems, metal organic vapor phase epitaxy (MOVPE) systems, resistance-heated-furnace diffusion/annealing systems, and rapid thermal processing (RTP) systems may be employed for the nanowire portion 110' growth, for example.

Nanowire portion 110' growth is initiated when adatoms resulting from decomposition of the particular semiconductor material-containing gas diffuse through or around the catalyst particle 122, and the adatoms precipitate on the underlying nanocrystalline ferromagnetic particles 120 which act as substrates for the growth. For example, for a Si-nanowire portion 110, growth is initiated by diffusing silicon adatoms resulting from decomposition of the silicon-containing gas through or around the catalyst particle 122, and precipitating the silicon adatoms on the underlying substrate (e.g., on the ferromagnetic particles 120). Moreover, growth of the nanowire portion 110' is continued with continued precipitation at the catalyst-nanowire interface. Such continued precipitation causes the catalyst particle 122 to remain at the tip of a free end of the growing nanowire or nanowire portion 110'. For example, when using either a $TiSi_2$ or Au—Si alloy catalyst particle 122, an amount of the respective $TiSi_2$ or Au—Si alloy remains at the tip of the free end of the growing nanowire portion 110'. The nanowire portion 110' grows in a columnar shape adjacent to the activated catalyst particle 122 and extends from the surface of the substrate 130 at a location of the ferromagnetic particle 120. The activated catalyst particle 122 at the tip has a similar diameter to that of the growing nanowire portion 110'. Therefore, recitation herein of growing the nanowire portion 110' 'from the ferromagnetic particle 120 on the substrate 130 surface'; growing the nanowire portion 110' 'from adjacent the catalyst particle 122 on the surface'; and growing the nanowire portion 110' 'adjacent the catalyst particle 122', and the like used herein, all refer to the mechanism of initial growth and continued growth described hereinabove.

When the nanowire portion 110' has grown to a target length, nanowire growth is halted. For example, the grown nanowire portion 110 may be removed from the presence of the precursor material-containing gas to halt growth. Alternatively, the gas flow into the chamber is stopped to cease the growth. At the target length, the nanowire portion 110 is said to be 'full-grown'.

Figure 3C:
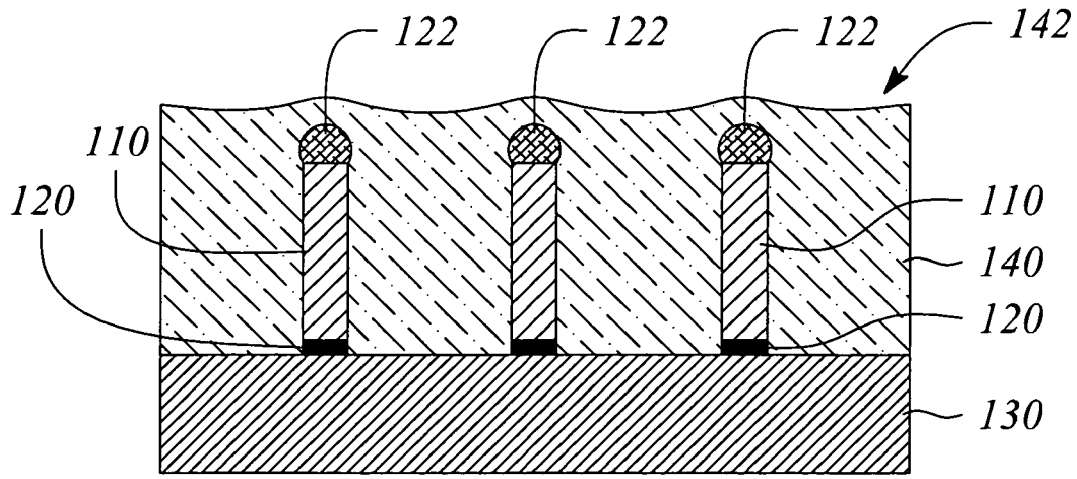
FIG. 3C illustrates a side view of full-grown nanowire portions and ferromagnetic particles of FIG. 3B protected by a resist layer according to an embodiment of the present invention.

The full-grown nanowire portions 110, along with the original ferromagnetic particles 120 and the catalyst particle 122 essentially at opposite ends of the nanowire portion 110, are then protected by applying a resist material. FIG. 3C illustrates the full-grown nanowire portions 110 and respective particles 120, 122 protected by a resist layer 140 according to an embodiment of the present invention. In some embodiments, the nanowire portions 110 with the respective particles 120, 122 are essentially covered by the resist layer 140, as illustrated in FIG. 3C.

Any number of resists may be employed. For example, the grown nanowire portions 110 with respective particles 120, 122 may be covered with an $SiO_2$ resist layer 140. In other examples, essentially any photoresist or polymer/monomer organic material may be employed. When applied using a 'spin-on' technique such materials are known to exhibit very good planarization. In addition, such polymer/monomer resist materials may be easily removed (e.g., by wet or dry etching).

After application of the resist layer 140, the catalyst particles 122 on the free end of the nanowire portions 110 are removed. For example, a top surface 142 of the resist layer 140 may be planarized using methods including, but not limited to, chemical etching, mechanical polishing, and chemical-mechanical planarization (CMP). During such planarizing, the catalyst particles 122 may be removed along with some of the material of the top surface 142 to expose the distal end 112' of the nanowire portion 110.

In another example, the planarization of the resist surface 142 exposes the catalyst particle 122 at or just above the planarized surface. For example, an etch back technique, especially a dry etch back technique, may be employed to expose the nanowire tips without using planarization. Then, a selective etchant or similar technique is employed to remove the catalyst particles 122 from the distal ends 112' of the nanowire portions 110. For example, the catalyst particles 122 may be removed by one or more of chemical wet etch, dry etch, sputter/plasma etch, polishing (e.g., chemical-mechanical planarization), as well as other known methods. Catalyst particles 122 comprising gold (Au) may be chemically dissolved using aqua regia, for example.

Figure 3D:
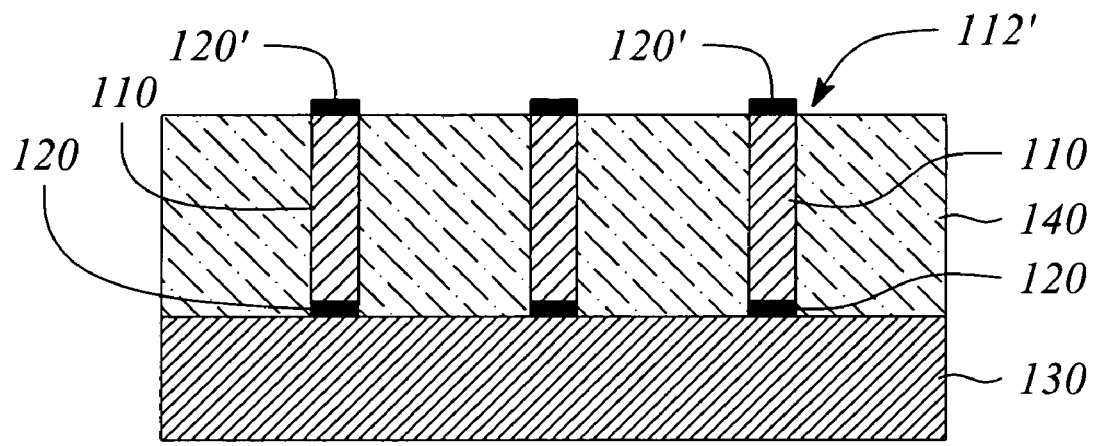
FIG. 3D illustrates a side view of applying a second set of nanocrystalline ferromagnetic particles to exposed nanowire portion ends of the full-grown nanowire portions of FIG. 3C according to an embodiment of the present invention.

A second set of nanocrystalline ferromagnetic particles 120' is applied to the ends 112' of the nanowire portions 110 exposed by removal of the catalyst particles 122. FIG. 3D illustrates applying the second set of nanocrystalline ferromagnetic particles 120' to the exposed ends 112' of the nanowire portions 110. The second set of nanocrystalline ferromagnetic particles 120' may be applied on the ends 112' in a manner that may be essentially similar to that used to provide the original or first set of nanocrystalline ferromagnetic particles 120 upon which the nanowire portions 110 were grown. The application of the second set of particles 120' to the ends 112' includes one or more of attached, formed, deposited and grown on the ends 112'.

Figure 3E:
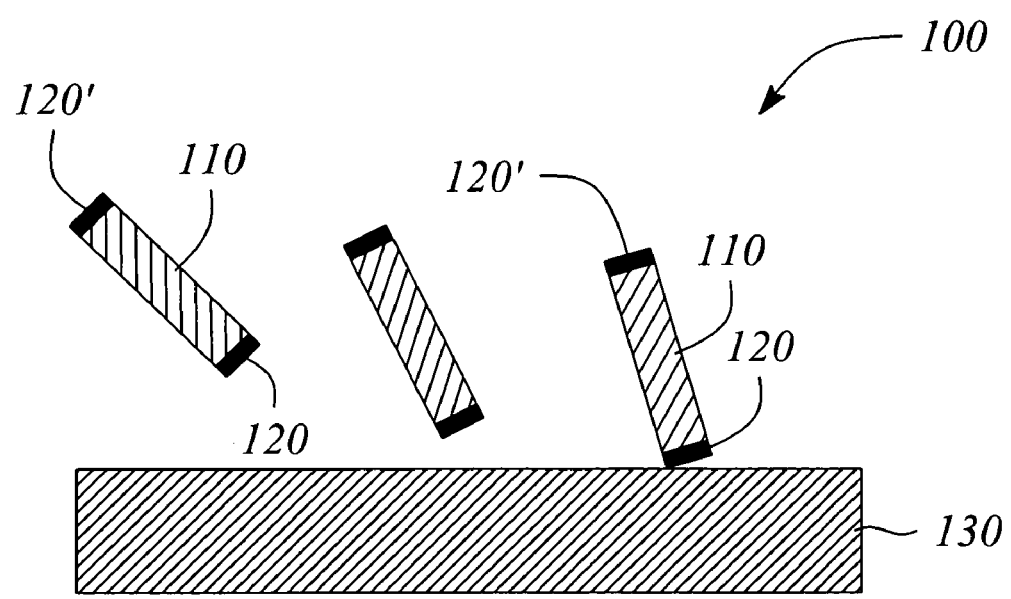
FIG. 3E illustrates a side view of self-aligning nanowires having been freed from the substrate of FIG. 3D according to an embodiment of the present invention.

The resist layer 140 material is selectively removed after the second set 120' is applied and the self-aligning nanowires 100 are freed from the substrate 130. FIG. 3E illustrates the self-aligning nanowires 100 having been freed from the substrate 130. For example, a resist layer 140 comprising $SiO_2$ may be selectively removed using an etchant such as, but not limited to, hydrofluoric acid, or buffered hydrofluoric acid. Likewise, a selective etchant may be employed to free the self-aligning nanowires 100 from the substrate. For example, if the substrate 130 comprises a layer of $SiO_2$ upon which the original ferromagnetic particles 120 are attached, the same etchant used to remove the $SiO_2$ resist layer 140 may be employed also to free the self-aligning nanowires 100 from the substrate 130.

Figure 4A:
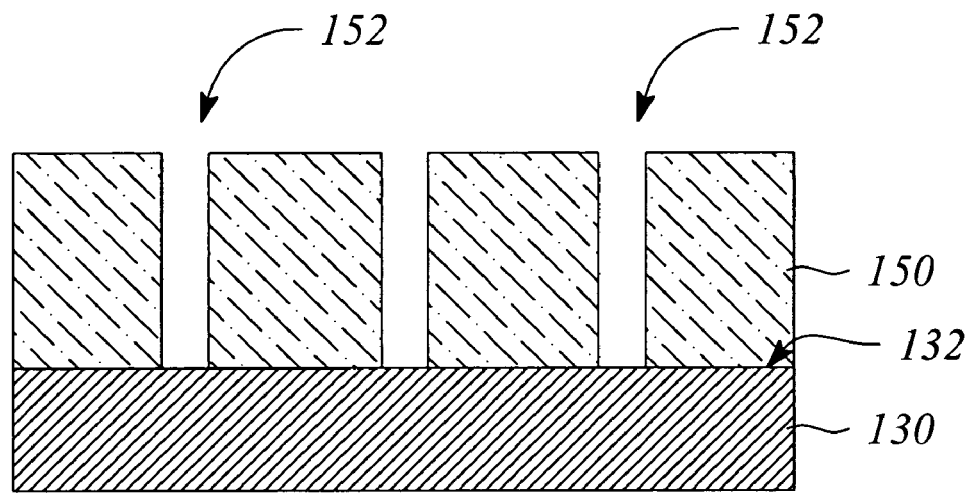
FIG. 4A illustrates a side view of a substrate with an overlying nanopore membrane according to an embodiment of the present invention.
Figure 4B:
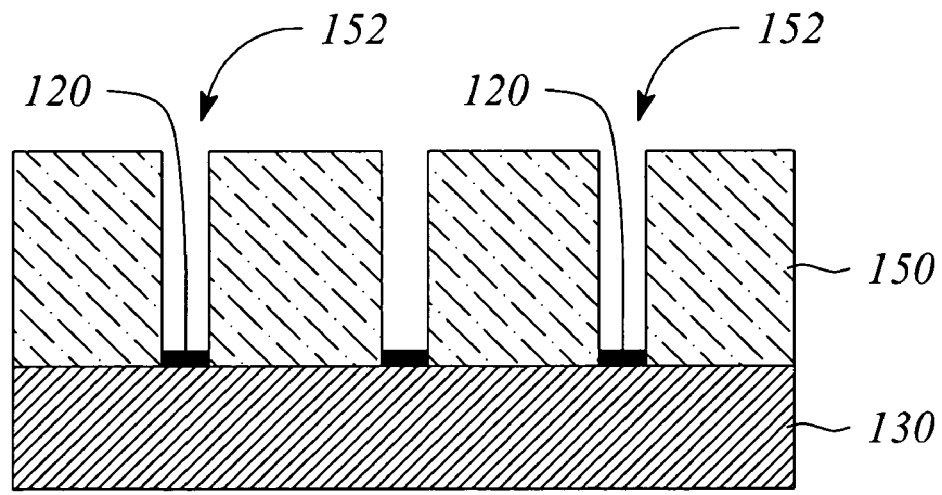
FIG. 4B illustrates a side view of depositing a first set of nanocrystalline ferromagnetic particles on a surface of the substrate within nanopores of the membrane of FIG. 4A according to an embodiment of the present invention.

FIGS. 4A-4D illustrate another exemplary method of producing self-aligning nanowires 100 with in-place aligning members 120 according to an embodiment of the present invention. FIG. 4A illustrates the substrate 130 with an overlying nanopore membrane 150. The substrate 130, or the surface 132 thereof, is conductive while the nanopore membrane 150 is essentially nonconductive. The nanopore membrane 150 comprises a plurality of nano-scale pores 152. FIG. 4B illustrates depositing nanocrystalline ferromagnetic particles 120 of the first set on the surface 132 of the substrate 130 within the nanopores 152 according to an embodiment of the present invention. For example, electrochemical deposition may be employed to deposit ferromagnetic material into the nanopores 152 to form the first set of nanocrystalline ferromagnetic particles 120.

Figure 4C:
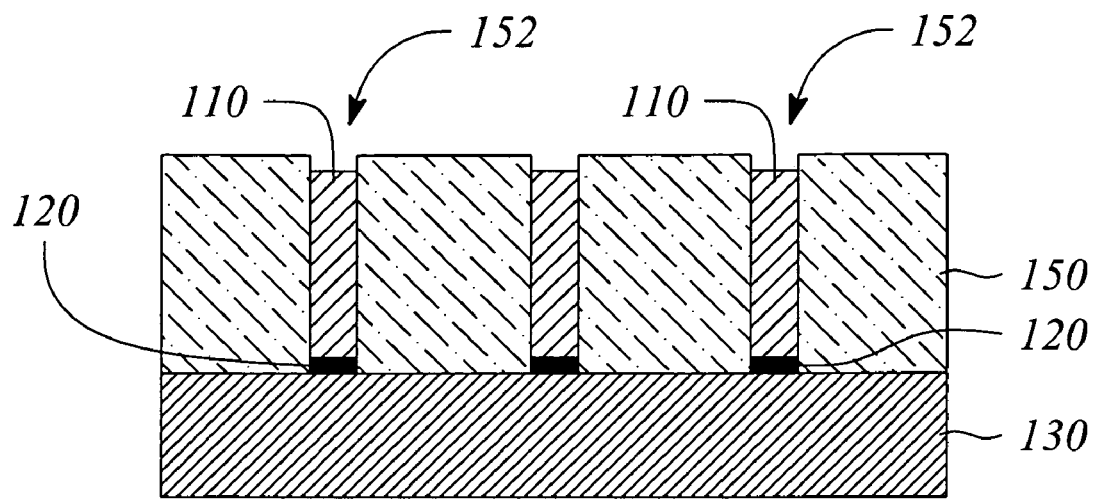
FIG. 4C illustrates a side view of forming nanowire portions on top of nanocrystalline ferromagnetic particles in the nanopores of FIG. 4B according to an embodiment of the present invention.

FIG. 4C illustrates forming nanowire portions 110 on top of the nanocrystalline ferromagnetic particles 120 in the nanopores 152. The nanowire portions 110 may be formed in the nanopores 152 by nanowire growth, as described hereinabove, and/or using hydrothermal growth, solvothermal growth, electroplating, chemical vapor deposition, and related methods.

Figure 4D:
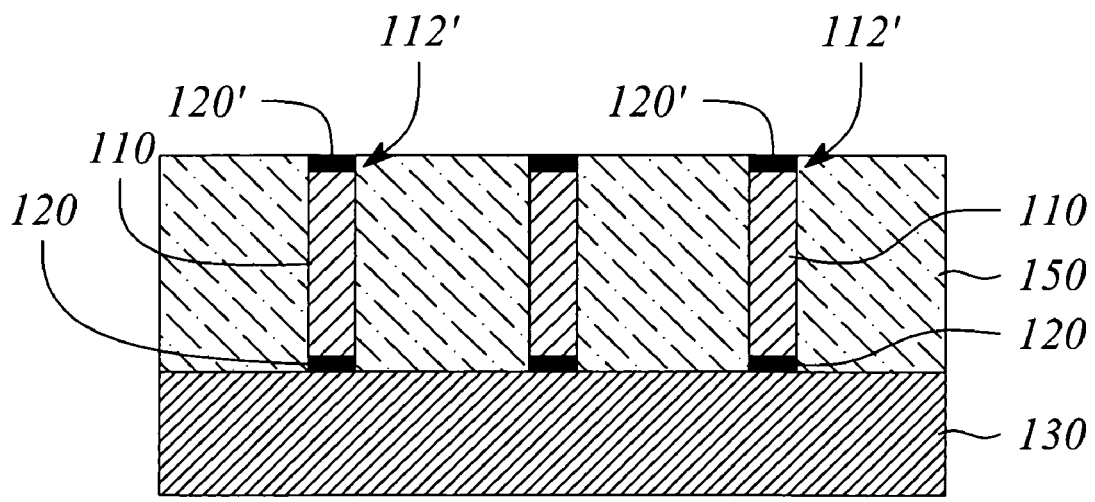
FIG. 4D illustrates a side view of depositing a second set of ferromagnetic particles on ends of nanowire portions of FIG. 4C according to an embodiment of the present invention.

FIG. 4D illustrates depositing the second set of ferromagnetic particles 120' on the free or exposed, distal ends 112' of the nanowire portions 110. For example, if the nanowire portions 110 are conductive, electrochemical deposition may be used to deposit the second set of ferromagnetic particles 120'. Following deposition of the second set of ferromagnetic particles 120', the nanopore membrane 150 and a portion of the substrate 130 are removed to free the self-aligning nanowires 100 with in-place aligning members 120, 120'.

Figure 5A:
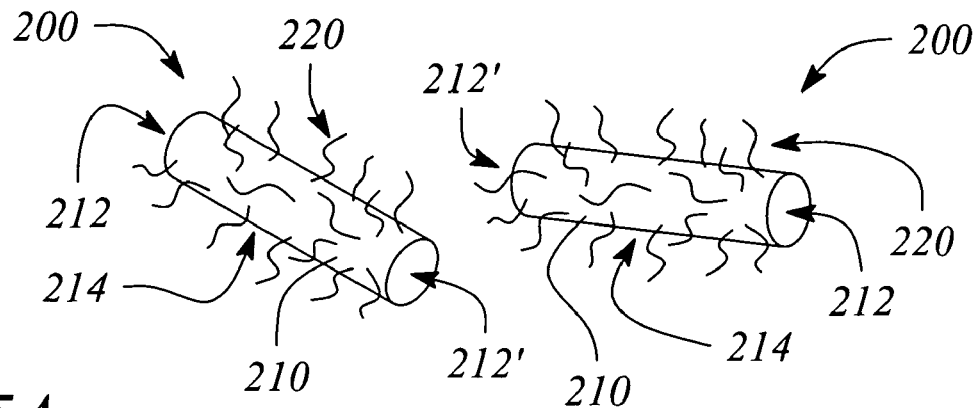
FIG. 5A illustrates a perspective view of self-aligning nanowires according to another embodiment of the present invention.

FIG. 5A illustrates self-aligning nanowires 200 according to another embodiment of the present invention. The self-aligning nanowire 200 comprises a nanowire portion 210 having distal ends 212, 212', essentially similar to the nanowire portion 110 having distal ends 112, 112' described above for the self-aligning nanowire 100. The self-aligning nanowire 200 further comprises an interactive portion or aligning member 220 associated with a side 214 of the nanowire portion 210. As illustrated in FIG. 5A, the aligning member 220 comprises one or more predominantly linear chemical compounds such as, but not limited to steric ligands, having an end which is attached to the side 214 of the nanowire portion 210 of the self-aligning nanowire 200. A remainder of the compound, including an opposite end thereof, is unrestrained to extend out or away from the side 214. The unrestrained end of the steric ligand compound is available to interact with other steric ligands. The distal ends 212, 212' of the nanowire portion 210 are essentially free of the aligning member 220 in this embodiment. In other embodiments (not illustrated), the aligning members 220 are attached to the distal ends 212, 212' of the nanowire portion 210 while the side 214 is essentially free of the aligning member 220. In still other embodiments, the aligning members 220 are attached to both the side 214 and at least one distal end 212, 212' of the nanowire portion 210.

In some embodiments, the steric ligand aligning members 220 interact to bond or commingle with steric ligand aligning members 220 of adjacent self-aligning nanowires 200. In other embodiments, the steric ligand aligning members 220 of adjacent self-aligning nanowires 200 repel one another. In still other embodiments, both attracting steric ligands and repelling steric ligands may be used as aligning members 220 to synergistically affect alignment according to an embodiment of the present invention. By way of example and not limitation, a repelling type steric ligand may be attached to the distal ends 212, 212' to discourage end-to-end alignment, while the attracting type of steric ligands may be attached to the side 214 of the nanowire portion 210 to encourage side-to-side alignment of the self-aligning nanowires 200.

Figure 5B:
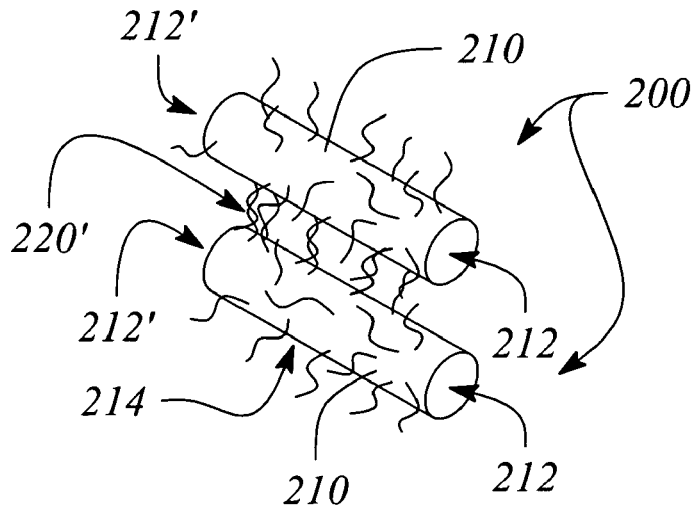
FIG. 5B illustrates a perspective view of the self-aligning nanowires of FIG. 5A aligned by an interactive force of aligning members according to an embodiment of the present invention.

In such embodiments, the self-aligning nanowires 200 with steric ligand aligning members 220 are allowed to move freely when suspended in a carrier solution. The movement includes a random or Brownian motion to eventually adjust a position of the individual nanowires 200, such that an energy of the attraction and/or the repulsion is reduced and in some embodiments, minimized. As such, the self-aligning nanowires 200 essentially align with one another due to the attraction/repulsion between the steric ligand aligning members 220. FIG. 5B illustrates the self-aligning nanowires 200 of FIG. 5A aligned side-to-side by attractive action of the steric ligand aligning members 220 on the side 214 of the nanowire portions 210 while the nanowires 200 are suspended in a carrier solution (not illustrated) according to an embodiment of the present invention.

A steric ligand, or a coordination compound that employs a ligand, is a complexing agent known in the art. Examples of steric ligands that may be employed as steric ligand aligning members 220 include, but are not limited to, branched chain polymers, alkanes, alkanethiols, organic molecules with either electron withdrawing or electron donating functional groups, and host-guest macromolecules which are based on a lock-and-key mechanism. For example, the lock-and-key mechanism is typically seen in antibody-antigen interactions (e.g., biotin-streptavidin), enzymes-small molecules interactions, proteins-small molecules interactions and organometallic compounds-active ligands interactions. Alternatively, various surfactants or surface-active agents, which may act in a manner similar to that of the steric ligands, may be attached the sides 214 and/or ends 212, 212' of the nanowire portions 210 to act as the aligning member 220 according to some embodiments.

Surfactants that may be used in these embodiments include, but are not limited to, detergents, such as linear alkyl sulfonates (LAS) and alkyl benzene sulfonates (ABS), wetting agents, such as alcohols and fatty acids, and emulsifiers, such as long chain alcohols, long chain fatty acids and soaps. For example, essentially any ligand having H-terminating group and another complementary ligand with OH-terminating group may be employed. In another example, essentially any ligand with precious metal group such as, but not limited to, gold (Au), platinum (Pt), palladium (Pd), and another ligand with a thiol group may be employed.

In still other embodiments, the aligning members 220 comprise both steric ligands and surfactants in a synergistic relationship to effect self alignment of the nanowires 200. For example, a surfactant dissolved in the carrier solution that is complementary to the steric ligand aligning member 220 may facilitate the action of the steric ligands to combine or repel, as necessary, to ultimately align the self-aligning nanowires 200.

In other embodiments, the aligning member 220 comprises an ionic moiety selected from an anionic group and a cationic group either directly attached or indirectly attached to the nanowire portion 210. The aligning member 220 is attached to or otherwise associated with one or both of the side 214 and a distal end 212, 212' of the nanowire portions 210 such that the ionic group is free or available to interact with complementary or oppositely charged groups on adjacent nanowires 200 according to some embodiments. In an example of indirect attachment of the ionic group, a chemical compound 220 having an ionic group may be attached to the nanowire portion 210 as the aligning member 220, such that the ionic group is unencumbered to interact for alignment purposes. In an example of a direct attachment of the ionic group, the ionic group 220 is attached to the nanowire portion 210 as the aligning member 220, such that the ionic properties of the ionic group are unencumbered for such interaction. Such chemical compounds having an ionic group include, but are not limited to, an anionic ligand, a cationic ligand, anionic surfactant, and a cationic surfactant, for example. Depending on the embodiment, the ionic aligning member 220 of the self-aligning nanowire 200 facilitates binding to the oppositely charged ionic aligning member 220 of another nanowire 200 in a proximate location thereto. Thus, a distal end-attached ionic aligning member 220 promotes end-to-end alignment/attachment between adjacent self-aligning nanowires 200 similar to the end-attached aligning members 120 described hereinabove with respect to the self-aligning nanowires 100 illustrated in FIG. 2A. Moreover, a side-attached ionic aligning member 220 promotes side-to-side alignment/attachment between adjacent self-aligning nanowires 200 similar to the side-attached steric ligand aligning members 220 illustrated in FIG. 5B.

Figure 6A:
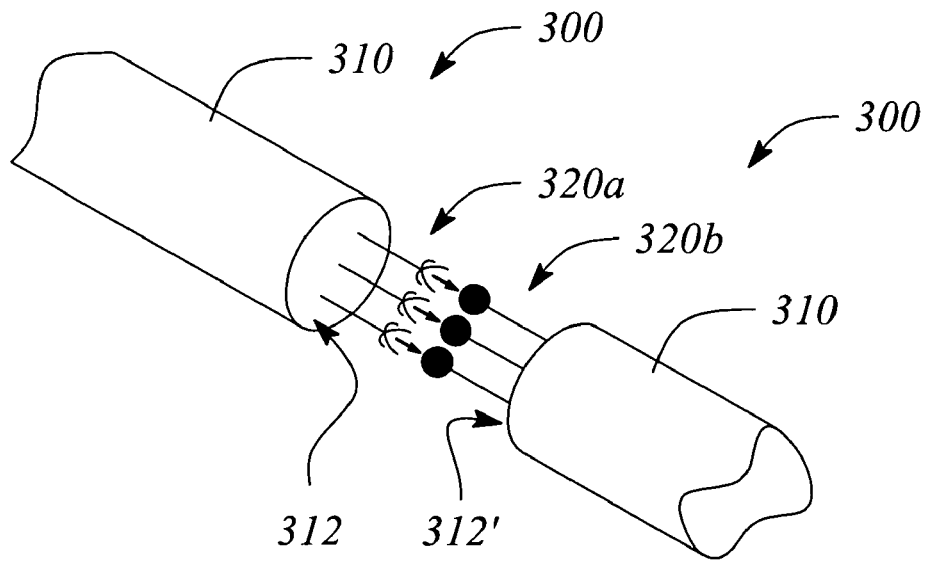
FIG. 6A illustrates a perspective view of self-aligning nanowires according to another embodiment of the present invention.

FIG. 6A illustrates self-aligning nanowires 300 according to another embodiment of the present invention, wherein alignment is based on and employs a host/guest complementary interaction of a specific binding pair. The self-aligning nanowire 300 comprises a nanowire portion 310 having distal ends 312, 312', essentially similar to the nanowire portion 110 having distal ends 112, 112' described above for the self-aligning nanowire 100. The self-aligning nanowire 300 further comprises a host member 320a of a host/guest aligning member pair 320. The host member 320a essentially receives (i.e., binds with) a complementary guest aligning member 320b on an adjacent self-aligning nanowire 300. The aligning members 320a, 320b of the specific binding pair 320 are different from each other but complementary. A member of a specific binding pair is defined as one of two different complementary molecules of the pair having an area on one or both of the surface of the molecule and in a cavity of the molecule that specifically binds to the other molecule of the pair. The molecule is considered as 'complementary' to a particular spatial and/or polar organization of the other molecule of the specific binding pair. Specific binding pairs are known in the art and include, but are not limited to, antibody-antigen pairs, receptor-ligand pairs, nucleotide-nucleotide pairs and enzyme-active site pairs. See, for example, Delenstarr, U.S. Pat. No. 6,428,957, which is incorporated by reference herein in its entirety.

In some embodiments illustrated in FIG. 6A, the aligning member pair 320 comprises an antibody aligning member 320a attached at the distal end 312 of a nanowire portion 310 of a first self-aligning nanowire 300 and a complementary antigen aligning member 320b attached at the distal end 312' of the nanowire portion 310 of a second self-aligning nanowire 300 such that their respective binding sites are free to interact. In some embodiments, the self-aligning nanowire 300 comprises both an antibody aligning member 320a at the distal end 312 and the complementary antigen aligning member 320b at the other distal end 312'. In other embodiments, the self-aligning nanowire 300 comprises either an antibody aligning member 320a at both distal ends 312, 312' or the complementary antigen aligning member 320b at both distal ends 312, 312'. When a plurality of the self-aligning nanowires 300 is suspended in a carrier solution in a complementary mixture, the antibody-based aligning members 320a connect or bind to complementary antigen-based aligning members 320b of adjacent nanowires 300 to align the self-aligning nanowires 300 in an end-to-end configuration in the carrier solution.

In some embodiments, a respective antibody or antigen aligning member 320a, 320b is attached to a side 314 of the nanowire portion 310 instead of the end 312, 312'. In a carrier solution comprising a complementary mixture of both self-aligning nanowires 300 with antibody aligning members 320a and self-aligning nanowires 300 with complementary antigen aligning members 320b attached on the nanowire sides 314, the self-aligning nanowires 300 will align and bind together due to the complementary interaction of the specific binding pair. Connection between adjacent self-aligning nanowires 300 through the complementary interaction aligns the nanowires 300 in a side-to-side or parallel configuration in this embodiment. The side-to-side or parallel alignment is similar to and sufficiently representative by that depicted in FIG. 5B for the side or parallel alignment of the self-aligning nanowire 200.

Figure 6B:
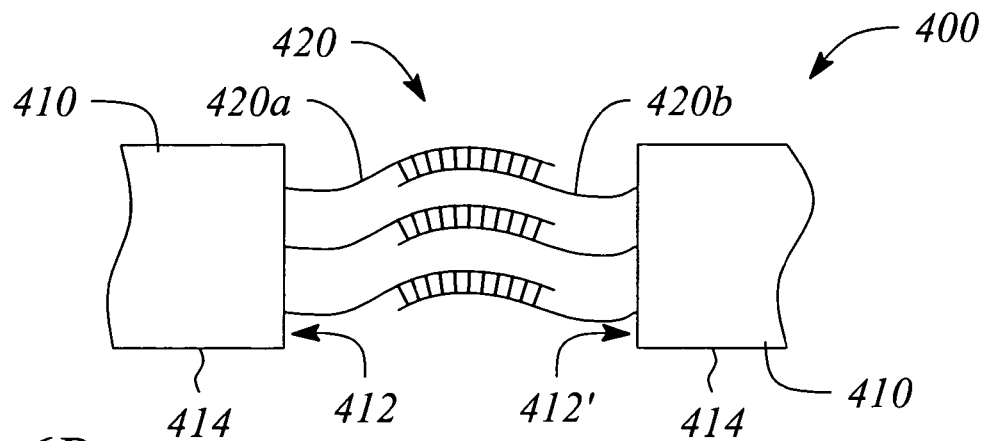
FIG. 6B illustrates a side view of self-aligning nanowires according to another embodiment of the present invention.

FIG. 6B illustrates self-aligning nanowires 400 that employ specific binding pair interactions according to another embodiment of the present invention. The exemplary self-aligning nanowires 400 illustrated in FIG. 6B comprise a nanowire portion 410 having distal ends 412, 412' essentially similar to the nanowire portion 110 having distal ends 112, 112' described above for the self-aligning nanowire 100. The self-aligning nanowire 400 further comprises a complementary member of a specific binding pair 420 as an aligning member 420a, 420b. In some embodiments, the aligning member pair 420 comprises complementary short sequences of nucleotides or complementary oligonucleotides, for example, as the aligning members 420a, 420b. The short sequences of nucleotides or the oligonucleotides may be from a naturally occurring or synthetic polynucleotide or a nucleic acid molecule, such as deoxyribonucleic acid (DNA) and ribonucleic acid (RNA), and any analogs thereof.

In other embodiments, the specific binding pair 420 for the complementary aligning members 420a, 420b includes, but is not limited to, a receptor-ligand (anti-ligand) pair, an enzyme-active site pair (e.g., nuclease-nucleotide) and a protein-nucleic acid pair. Again see U.S. Pat. No. 6,428,957, incorporated by reference herein in its entirety, for definitions, materials and processes for use of various specific binding pairs, for example. Effectively, the complementary aligning member pairs 320, 420 illustrated in FIGS. 6A and 6B may be replaced with any other biological or chemical molecules, which provide complementary binding properties that are familiar to one skilled in the art, and still be within the scope of these embodiments of the present invention.

The aligning member pair 420 may be attached on a distal end 412, 412' of the nanowire portion 410, on a side 414 of the nanowire portion 410 or on both of the end 412, 412' and the side 414, depending on the embodiment, such that the respective binding sites of the pair are free to interact. As illustrated in FIG. 6B, first oligonucleotides 420a are attached to end 412 of the nanowire portion 410 of a first self-aligning nanowire 400. Moreover, second oligonucleotides 420b, which are complementary to the first oligonucleotides, are attached to the end 412' of the nanowire portion 410 of a second self-aligning nanowire 400. Alternatively, the first oligonucleotides 420a are attached to the distal ends 412, 412' of the nanowire portion 410 of the first self-aligning nanowire 400 while the second complementary oligonucleotides 420b are attached to the distal ends 412, 412' of the nanowire portion 410 of the second self-aligning nanowire 400, depending on the embodiment. The illustrated self-aligning nanowires 400 are aligned end-to-end according to these embodiments using hybridization or binding of the complementary nucleotide members of the oligonucleotides 420a, 420b. In a carrier solution having a mixture of such complementary self-aligning nanowires 400 and the ingredients known in the art to facilitate hybridization, the complementary oligonucleotides 420a, 420b will bind to one another from adjacent ones of the self-aligning nanowires 400 using complementary base pair binding to align the nanowires 400 end-to-end.

In some embodiments, the complementary oligonucleotides serving as aligning members 420a, 420b may be attached to the side 414 of the respective nanowire portion 410, as mentioned above, either in addition to or in lieu of the ends 412, 412'. In a carrier solution having a mixture of such complementary self-aligning nanowires 400 and the hybridization ingredients, the binding of the complementary side-attached oligonucleotide aligning members 420a, 420b causes the nanowires 400 to self-align in a side-by-side or parallel configuration similar to that illustrated in FIG. 5B.

Given the discussion hereinabove, one skilled in the art may readily devise additional embodiments of the self-aligning nanowire that are within the scope of the present invention. For example, ends of the nanowire portion may be capped with a metal to induce metallic bonding or another association between adjacent nanowires for self-alignment. In such embodiments, the metal caps are the aligning members according to the present invention.

In some embodiments, either a hydrophobic group or a hydrophilic group may be directly attached or indirectly attached to the nanowire portion to interact with the respective hydrophilic or hydrophobic group on the adjacent nanowire and to further interact with a local environment suspending the adjacent nanowires for self-alignment. For an indirect attachment example, a surfactant or other organic compound having a chemical moiety selected from a hydrophobic group and a hydrophilic group may be attached to the nanowire portion to serve as aligning members with the hydrophobic or hydrophilic group unencumbered to so interact. In an example of direct attachment, the hydrophobic or hydrophilic group is attached to the nanowire portion such that hydrophobic or hydrophilic properties of the respective group are unencumbered. A group that imparts either a hydrophobic property or a hydrophilic property includes, but is not limited to, an alkyl chain, a phenol group and a hydroxyl group, for example. Other groups that provide either a hydrophobic or hydrophilic property are known to those skilled in the art and are within the scope of this embodiment.

When suspended in an aqueous solution, the interaction of the hydrophobic groups and the aqueous solution, for example, will induce an alignment of the nanowires that reduces, and in some instances tends to minimize, an exposure of the hydrophobic groups to the aqueous solution. Oppositely, the interaction of the hydrophilic groups and the aqueous solution, for example, will induce an alignment of the nanowires that increases, and in some instances tends to maximize, an exposure of the hydrophilic groups to the solution. Judicious choice of locations for attaching the hydrophobic and/or hydrophilic groups may be used to determine an aligned configuration that is realized by such an embodiment of the self-aligning nanowires suspended in an aqueous solution.

As with the previously described embodiment 100, the various embodiments of the self-aligned nanowires 200, 300, 400 retain their alignment when deposited on a substrate due to the respective interacted aligning members 220, 320, 420 thereof. To connect or fuse together the respective self-aligned nanowires deposited on the substrate, for mechanical or electrical purposes, the respective aligning members may be removed from the deposited aggregate structure using selective chemical etching, for example. Such removal may otherwise improve a connection between the self-aligned nanowires. Moreover, thermal annealing and/or other methods may be employed to connect and/or improve a connection between the respective self-aligned nanowires in the deposited aggregate structure on the substrate. Again, see co-pending U.S. patent application Ser. No. 11/077,830, incorporated by reference and cited supra, for example.

In yet another example, a choice of solvent and/or surfactants in a carrier solution, such as an ink formulation, may be employed to control evaporation of the solvent in such a way that nanowires suspended therein essentially self-assemble or self-align. For example, candidate solvent/surfactants include, but are not limited to, water/polyvinyl alcohol and water/polyethylene oxide. An example applicable to the present invention in which a solvent (toluene) and a rod coil diblock polymer are employed is described by J. W. Park and E. L. Thomas in, "Multiple ordering transitions: hierarchical self-assembly of rod-coil block copolymers", Adv. Mater., 2003, 15, pp. 585, incorporated herein by reference.

Figure 7:
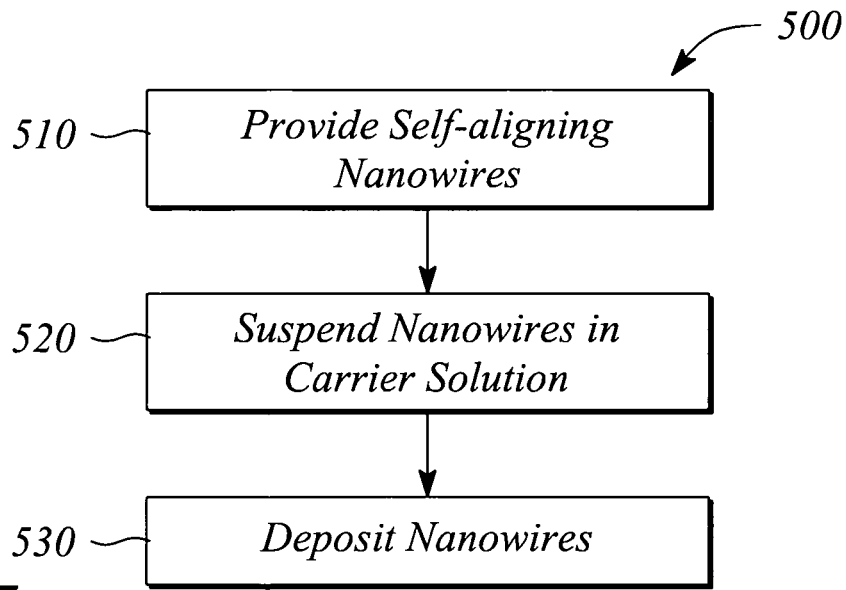
FIG. 7 illustrates a flow chart of a method of aligning nanowires according to an embodiment of the present invention.

FIG. 7 illustrates a flow chart of a method 500 of aligning nanowires according to an embodiment of the present invention. The method 500 of aligning comprises wherein the nanowires comprise a nanowire portion and an aligning member. In some embodiments, the nanowire portion comprises a crystalline lattice of one or more of a conductive, semi-conductive, and nonconductive material. For example, the nanowire portion may be a doped silicon lattice representing a semiconductor material. In some embodiments, the nanowire portion is essentially similar to the nanowire portion 110, 210, 310, 410 described hereinabove with respect to the self-aligning nanowires 100, 200, 300, 400.

The aligning member may be one or more of an end-attached aligning member and a side-attached aligning member. The aligning member interacts with an aligning member of an adjacent nanowire to facilitate alignment of the nanowires. For example, the aligning member may be a ferromagnetic particle attached to one or both ends of the nanowire portion that interacts magnetically to self-align similar to the self-aligning nanowire 100. In another example, the aligning member may be a side-attached moiety selected from a steric ligand, an ionic ligand, ionic surfactant, a hydrophilic molecule and a hydrophobic molecule that interacts attractively or spatially with one or both of other side-attached aligning members on adjacent nanowires and the surrounding environment to facilitate self-alignment similar to the self-aligning nanowire 200. In yet another example, the aligning member may be one or both of a side-attached and an end-attached member of a specific binding pair that interacts by complementary binding to another member of the specific binding pair similar to the self-aligning nanowires 300, 400. Depending on the embodiment, the aligning member is essentially similar to any of the aligning members 120, 220, 320, 420 of the self-aligning nanowires 100, 200, 300, 400 described above.

The method 500 further comprises suspending 520 the plurality of self-aligning nanowires in a carrier solution. For example, the carrier solution may be a fluid, such as an aqueous solution or a nonaqueous solution. Furthermore, the carrier solution may be employed as part of an ink in a deposition system such as, but not limited to, an inkjet printer. While suspended in the carrier solution, the aligning members of adjacent self-aligning nanowires interact with one or more of each other and a local environment. As a result of the interaction, the self-aligning nanowires align with one another. A characteristic of the aligning is determined by a nature and the location of the aligning members. For example, aligning members that exhibit a mutual attraction, attractive association and/or bonding that are end-attached aligning members on adjacent self-aligning nanowires produce nanowires aligned in end-to-end configurations. Side-attached aligning members that exhibit one or more of mutual attraction, attractive association and/or bonding produce side-by-side or parallel nanowire configurations.

The method 500 further comprises depositing 530 the suspended self-aligning nanowires. For example, the suspended self-aligning nanowires may be deposited on a substrate using an inkjet deposition system. In some embodiments, the method 500 further comprises removing the carrier solution to produce an aligned cluster of self-aligning nanowires. For example, the carrier solution may be removed by evaporation to produce an aligned cluster of nanowires on the substrate.

In some embodiments, the aligned cluster of self-aligning nanowires is a linear or wire-like structure or trace on the substrate that has a length-dominated aspect ratio. The aligned cluster trace includes a portion along its length that is one or more of straight, branched and curved, for example, Moreover, a portion of the aligned cluster trace may have one or both of a constant width and a variable width.

In other embodiments, the aligned cluster of self-aligning nanowires is a planar film on the substrate that may cover all or a portion of the substrate surface. The aligned cluster film may be used as a dielectric layer or a conductive layer (e.g., ground plane), for example, in a single layer nano-scale device or a multilayer nano-scale device. Moreover, the aligned cluster film may be used as a starting layer that may be processed into a variety of shapes, such as the wire-like structure or trace, for example.

In another embodiment of the present invention, an ink formulation for an inkjet printer is provided. The ink formulation comprises a plurality of self-aligning nanowires suspended in a carrier solution. The carrier solution comprises a solvent such as, but not limited to, water, an alcohol (e.g. methanol, ethanol, etc.), a hydrocarbon, or an organic solvent (e.g., polyvinyl alcohol, polyvinylpyrolidione, etc.), for example. The self-aligning nanowires comprise a nanowire portion and an aligning member. In some embodiments, the self-aligning nanowire is essentially similar to any of the self-aligning nanowire 100, 200, 300, 400 embodiments described hereinabove. The plurality of self-aligning nanowires 100 illustrated in FIG. 2A as suspended in a carrier solution is sufficiently representative of an embodiment of an ink formulation according to the present invention.

Figure 8:
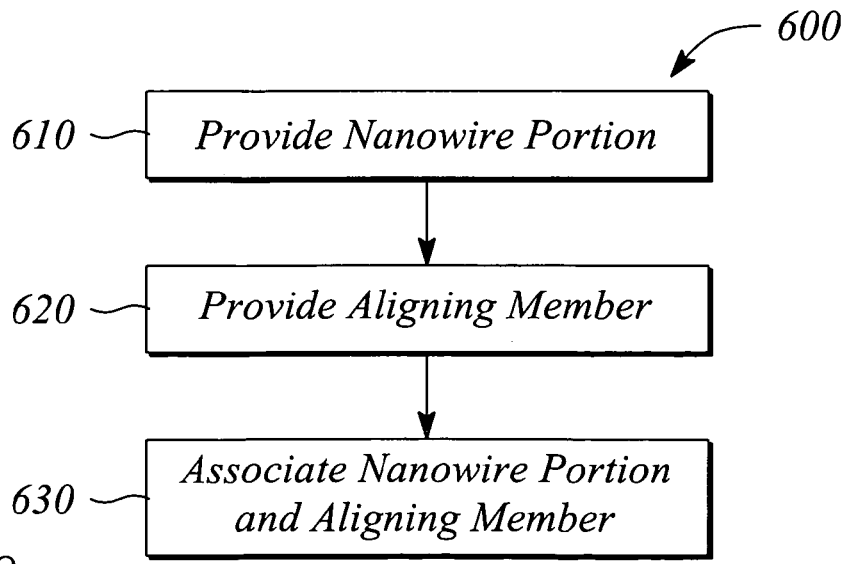
FIG. 8 illustrates a flow chart of a method of producing self-aligning nanowires according to an embodiment of the present invention.

FIG. 8 illustrates a flow chart of a method 600 of producing self-aligning nanowires according to an embodiment of the present invention. The method 600 comprises providing 610 a nanowire portion. In some embodiments, the nanowire portion is essentially the nanowire portion 110 described hereinabove with respect to the self-aligning nanowire 100. The method 600 of producing a self-aligning nanowire further comprises providing 620 an aligning member. The aligning member interacts with other aligning members of adjacent self-aligning nanowires to align the nanowires, as discussed above. In some embodiments, the aligning member is essentially similar to any of the aligning members 120, 220, 320, 420 described hereinabove with respect to the self-aligning nanowires 100, 200, 300, 400. The order of providing 610 a nanowire portion and providing 620 an aligning member of the method 600 may be reversed and still be within the scope of the present invention. The method 600 of producing self-aligning nanowires further comprises associating 630 the aligning member with the nanowire portion to produce the self-aligning nanowire.

For example, the nanowire portion may be provided 610 by growing the nanowire portion as a nanowire using one or more of vapor-liquid-solid (VLS), solution-liquid-solid (SLS), and non-catalytic vapor-phase epitaxy. Additionally, any of template-assisted synthesis, nanoimprint lithography, dip-pen nanolithography, self-assembly of nanoparticles, solution phase methods based on capping reagents, and solvothermal methods may be employed to provide 610 the nanowire portion.

Providing 620 an aligning member comprises providing a member that interacts with one of another of the same or similar member, an oppositely charged member, a spatially compatible member, a different but complementary member, and a local environment, as described above, for example. As such, the aligning member may be provided 620 by any means for creating or fabricating such aligning members including those known in the art. For example, the aligning member may be a nanocrystalline ferromagnetic particle, such as that described above for the aligning member 120. The ferromagnetic particle is fabricated using conventional nanoparticle fabrication methods. In another example, the aligning member may be a steric ligand or surfactant, an ionic ligand or surfactant, a hydrophilic molecule, a hydrophobic molecule or a specific binding pair, in which case providing comprises employing synthesis methods known in the art for producing aligning members. U.S. Pat. No. 6,428,957, cited supra and incorporated by reference herein, provides synthesis and attachment information for some specific binding pair members. Alternatively, any of the embodiments of aligning members described above may be purchased from suppliers that provide such products (e.g., Sigma-Aldrich of St. Louis, Mo. and ALFA AESAR of Ward Hill, Mass.). Many of such suppliers are familiar to those skilled in the art and need not be listed here. Such purchased products may be used in the method 600 of producing a self-aligning nanowire according to the present invention.

Associating 630 the nanowire portion and the aligning member generally comprises attaching the nanowire portion and the aligning member together. In some embodiments, the aligning member is attached to the nanowire portion. In other embodiments, the nanowire portion is formed on and therefore, attached to the aligning member. In some embodiments, a combination of both forming the nanowire portion on and attaching the aligning member is used. See for example, that described above for FIGS. 3A-3E and 4A-4D. The aligning member may be located one or more of on an end and on a side of the nanowire portion, as described above. For example, a pair of end-attached aligning members may be attached to respective ends of the nanowire portion in some embodiments. In another example, side-attached aligning members may be attached to a side of the nanowire portion leaving the ends essentially free of aligning members in some embodiments.

In some embodiments, associating 630 occurs concomitant with one or more of providing 610 the nanowire portion and providing 620 the aligning member. Examples of concomitantly associating 630 are illustrated in FIGS. 3A-3E and FIGS. 4A-4C and described above. For example, a first end-attached aligning member (e.g., nanocrystalline ferromagnetic particle) is fabricated or deposited on a substrate. A nanowire portion is then grown on the first end-attached aligning member. A second end-attached aligning member (e.g., nanocrystalline ferromagnetic particle) is then fabricated or deposited on a free end of the grown nanowire portion. In some embodiments, the second end-attached aligning member is formed on the free end following removal of a catalyst particle used to grow the nanowire portion. Depending on the embodiment of the aligning member used, a surface treatment that is known in the art may be used on the nanowire portion to facilitate attachment of the respective aligning member to the surface of the nanowire portion.

Thus, there have been described embodiments of a self-aligning nanowire and a method aligning nanowires. Further, various embodiments of a method of producing a self-aligning nanowire and an ink formulation employing self-aligning nanowires have been described. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A self-aligning nanowire comprising:
   a nanowire portion; and
   an aligning member attached to the nanowire portion, the aligning member comprising one or both of:
      a chemical compound attached to a side of the nanowire portion, the chemical compound providing one or both of an attractive force and a repulsive force that interacts with another chemical compound on a side of an adjacent nanowire; and
      a nanocrystalline ferromagnetic particle attached on a distal end of the nanowire portion that provides a magnetic force on a ferromagnetic particle on a distal end of the adjacent nanowire,
wherein the aligning member aligns the adjacent nanowires together one or both of end-to-end and side-to-side.

2. The self-aligning nanowire of claim 1, wherein the chemical compound has one or more of steric, ionic, hydrophobic, hydrophilic and complementary properties to facilitate interaction with the chemical compound on the adjacent nanowire.

3. The self-aligning nanowire of claim 1, further comprising a surfactant associated with the nanowire portion to facilitate the interaction of the aligning members on the adjacent nanowires.

4. The self-aligning nanowire of claim 1, wherein the chemical compound aligning member comprises a steric ligand, the steric ligand further providing a spatial property to interact with a steric ligand on the adjacent nanowire for self-alignment.

5. The self-aligning nanowire of claim 1, wherein the chemical compound aligning member comprises a sequence of nucleotides attached to the side of the nanowire portion, the aligning member hybridizing to a complementary nucleotide sequence aligning member on the adjacent nanowire for self-alignment.

6. The self-aligning nanowire of claim 1, further comprising a carrier solution to suspend a plurality of the self-aligning nanowires, the carrier solution facilitating alignment among the self-aligning nanowires of the plurality.

7. The self-aligning nanowire of claim 6, wherein the carrier solution and the suspended plurality provide an ink formulation used in an ink deposition system.

8. A self-aligning nanowire comprising:
a nanowire portion;
an aligning member attached to the nanowire portion, wherein the aligning member comprises one or more of:
either an antibody or an antigen of a complementary antibody-antigen pair attached to one or both of a side and a distal end of the nanowire portion, the aligning member using a host/guest interaction to bind with a complementary aligning member on the adjacent nanowire;
a hydrophilic group or a hydrophobic group directly or indirectly attached to one or both of the side and an end of the nanowire portion, the aligning member further interacting with a local environment that suspends the self-aligning nanowire to align with the adjacent nanowire; and
an ionic group directly or indirectly attached to one or both of a side and an end of the nanowire portion that interacts with an oppositely charged ionic aligning member on the adjacent nanowire,
wherein the aligning member interacts with another aligning member on an adjacent nanowire to align the nanowires together to provide self-alignment.

9. The self-aligning nanowire of claim 1, wherein the chemical compound aligning member comprises a member of a specific binding pair attached to the side of the nanowire portion, the member of the binding pair bonding with a complementary aligning member of the specific binding pair on the adjacent nanowire for self-alignment.

10. The self-aligning nanowire of claim 9, wherein the specific binding pair is selected from complementary nucleotide sequences, complementary oligonucleotides, a complementary receptor-ligand pair, a complementary enzyme-active site pair and a complementary antibody-antigen pair.

11. The self-aligning nanowire of claim 8, wherein the aligning member further comprises a nanocrystalline ferromagnetic particle attached on distal ends of the nanowire portion, the ferromagnetic particles using magnetic forces to interact with other ferromagnetic particles on a distal end of the adjacent nanowire to align the nanowires one or both of end-to-end and side-to-side.

12. The self-aligning nanowire of claim 8, further comprising a carrier solution to suspend a plurality of the self-aligning nanowires, the carrier solution facilitating alignment among the self-aligning nanowires of the plurality.

13. The self-aligning nanowire of claim 8, wherein the carrier solution and the suspended plurality provide an ink formulation used in an ink deposition system.

14. A method of aligning nanowires comprising:
providing a plurality of self-aligning nanowires, a self-aligning nanowire comprising a nanowire portion and an aligning member attached to the nanowire portion;
suspending the self-aligning nanowires in a carrier solution, the aligning members of the self-aligning nanowires interacting with one or more of each other and a carrier solution environment to facilitate self-alignment of the nanowires with each other; and
depositing the suspended self-aligning nanowires on a substrate.

15. The method of aligning nanowires of claim 14, further comprising removing the carrier solution from the deposited self-aligning nanowires to produce a cluster of self-aligned nanowires on the substrate.

16. The method of aligning nanowires of claim 15, further comprising removing the aligning members from the deposited self-aligning nanowires and fusing the self-aligned nanowires such that the cluster is an interconnected cluster.

17. An ink formulation for an inkjet printer deposition system, the ink formulation comprising:
a plurality of self-aligning nanowires, a self-aligning nanowire comprising a nanowire portion and an aligning member attached to the nanowire portion, the aligning member interacting with the aligning member of another self-aligning nanowire of the plurality to align the nanowires; and
a carrier solution, the plurality of self-aligning nanowires being suspended in the carrier solution, wherein the carrier solution facilitates alignment of the self-aligning nanowires with each other.

18. The ink formulation of claim 17, wherein the aligning member is a nanocrystalline ferromagnetic particle attached on distal ends of the nanowire portion, the ferromagnetic particles using magnetic forces to interact with other ferromagnetic particles on a distal end of the adjacent nanowire to align the nanowires one or both of end-to-end and side-to-side.

19. The ink formulation of claim 17, wherein the aligning member comprises a chemical compound attached to one or both of a side and a distal end of the nanowire portion such that the chemical compound is free to interact, the chemical compound using one or both of attractive and repulsive forces to interact with the aligning member on the adjacent nanowire for self-alignment, the chemical compound having one or more of steric, ionic, hydrophobic, hydrophilic and complementary properties to facilitate interaction with the adjacent nanowire aligning member.

20. The ink formulation of claim 17, wherein the aligning member comprises a steric ligand on one or both of a side and a distal end of the nanowire portion, the steric ligand using one or more of an attractive force, a repulsive force and a spatial property to interact with a steric ligand on the adjacent nanowire for self-alignment.

21. The ink formulation of claim 17, wherein the aligning member comprises a sequence of nucleotides attached to one or both of a side and a distal end of the nanowire portion, the aligning member hybridizing to a complementary nucleotide sequence aligning member on the adjacent nanowire for self-alignment.

22. The ink formulation of claim 17, wherein the aligning member comprises either an antibody or an antigen of a complementary antibody-antigen pair attached to one or both of a side and a distal end of the nanowire portion, the aligning member using a host/guest interaction to bind with a complementary aligning member on the adjacent nanowire for self-alignment.

23. The ink formulation of claim 17, wherein the aligning member comprises a member of a specific binding pair attached one or both of a side and a distal end of the nanowire portion, the member of the binding pair bonding with a complementary aligning member of the specific binding pair on the adjacent nanowire for self-alignment.

24. The ink formulation of claim 23, wherein the specific binding pair is selected from complementary nucleotide sequences, complementary oligonucleotides, a complementary receptor-ligand pair, a complementary enzyme-active site pair and a complementary antibody-antigen pair.

* * * * *